United States Patent [19]

Gnade et al.

[11] Patent Number: 5,750,415

[45] Date of Patent: May 12, 1998

[54] LOW DIELECTRIC CONSTANT LAYERS VIA IMMISCIBLE SOL-GEL PROCESSING

[75] Inventors: Bruce E. Gnade, Dallas; Chih-Chen Cho, Richardson, both of Tex.; Douglas M. Smith, Albuquerque, N. Mex.

[73] Assignee: Texas Instruments Incorporated, Dallas, Tex.

[21] Appl. No.: 250,747

[22] Filed: May 27, 1994

[51] Int. Cl.⁶ .................................................. H01L 21/44
[52] U.S. Cl. .................................... 437/195; 437/228
[58] Field of Search .................................. 437/195, 235, 437/927, 228; 148/DIG. 73

[56] References Cited

U.S. PATENT DOCUMENTS

| | | |
|---|---|---|
| 3,689,992 | 9/1972 | Schutze et al. . |
| 5,098,856 | 3/1992 | Beyer et al. ............................ 437/65 |
| 5,103,288 | 4/1992 | Sakamoto et al. . |
| 5,444,015 | 8/1995 | Aitken et al. ............................ 437/182 |
| 5,461,003 | 10/1995 | Havemann et al. ...................... 437/187 |
| 5,598,026 | 1/1997 | Kapoor et al. ........................... 257/634 |

*Primary Examiner*—John Niebling
*Assistant Examiner*—C. Everhart
*Attorney, Agent, or Firm*—Kay Houston; W. James Brady, III; Richard L. Donaldson

[57] ABSTRACT

A method for forming air gaps 22 between metal leads 16 of a semiconductor device. A metal layer is deposited on a substrate 12. The metal layer is etched to form metal leads 16, exposing portions of the substrate 12. A disposable liquid 18 is deposited on the metal leads 16 and the exposed portions of substrate 12, and a top portion of the disposable liquid 18 is removed to lower the disposable liquid 18 to at least the tops of the leads 16. A porous silica precursor film 20 is deposited on the disposable liquid 18 and over the tops of the leads 16. The porous silica precursor film 20 is gelled to form a low-porosity silica film 24. The disposable liquid 18 is removed through the low-porosity silica film 24 to form air gaps 22 between metal leads 16 beneath the low-porosity silica film 24. The air gaps 22 have a low dielectric constant and result in reduced capacitance between the metal leads and decreased power consumption.

15 Claims, 4 Drawing Sheets

LOW DIELECTRIC CONSTANT LAYERS VIA IMMISCIBLE SOL-GEL PROCESSING

CROSS-REFERENCE TO RELATED APPLICATIONS

The following co-assigned U.S. patent applications are hereby incorporated herein by reference:

| TI Case | Serial No | Filing Date | Inventor | Title |
|---|---|---|---|---|
| TI-18509 | 08/137,658 | 10/15/93 | Jeng | Planarized Structure for Line-to-Line Capacitance Reduction |
| TI-18867 | 08/201,679 | 2/25/94 | Jeng et al | Selective Filling Narrow Gaps with Low dielectric-constant materials |
| TI-18929 | 08/202,057 | 2/25/94 | Jeng | Planarized Multilevel Interconnect Scheme with Embedded Low dielectric-Constant Insulators |
| TI-19068 | 08/234,443 | 4/28/94 | Cho | Low Dielectric Constant Insulation in VLSI applications |
| TI-19071 | 08/234,099 | 4/27/94 | Havemann | Via Formation in Polymeric Materials |
| TI-18941 | 08/247,195 | 5/20/94 | Gnade et al | A Low Dielectric Constant Material For Electronics Applications |
| TI-19072 | 08/246,432 | 5/20/94 | Havemann et al | Interconnect Structure with an Integrated Low Density Dielectric |

The following U.S. patent applications filed concurrently herewith the patent application for the present invention, are also incorporated herein by reference:

| TI Case | Serial No | Inventor | Title |
|---|---|---|---|
| TI-19073 | 08/250,192 | Tigelaar et al | Suppression of Interlead Leakage when using Airgap dielectric |
| TI-19154 | 08/250,062 | Tsu | Reliability Enhancement of Aluminum interconnects by Reacting Aluminum Leads with a Strengthening Gas |
| TI-19253 | 08/250,142 | Havemann | Two-step Metal Etch Process for Selective Gap Fill of Submicron Interconnects and Structure for Same |
| TI-19305 | 08/250,063 | Havemann et al | Multilevel Interconnect Structure with Air Gaps Formed Between Metal Leads |

FIELD OF THE INVENTION

This invention relates generally to the fabrication of semiconductor devices, and more specifically to sol-gel processing and the formation of air gaps as a low dielectric constant material between metal leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections. The need to integrate more functions onto a chip has caused the semiconductor industry to search for ways to shrink, or scale, the size of individual transistors and other devices commonly integrated on a chip. However, scaling devices to smaller dimensions can create a multitude of undesirable effects. One of these effects is an increase in the capacitive coupling between conductors in a circuit. Therefore, it becomes imperative to reduce the RC time constant and cross-talk between metal lines, within today's multi-level metallization systems.

The capacitance between conductors is highly dependent on the insulator, or dielectric, used to separate them. Conventional semiconductor fabrication commonly employs silicon dioxide as a dielectric, which has a dielectric constant of about 3.9. The lowest possible, or ideal, dielectric constant is 1.0, which is the dielectric constant of a vacuum.

SUMMARY OF THE INVENTION

For a given interconnect layout, both power consumption and crosstalk decrease, and performance increases, as the dielectric constant of the insulator decreases. It has been found that using the same dielectric, scaling down from 0.50 μm to 0.25 μm will result in a 30% increase in power consumption. This power consumption can be decreased by more than 50% if $SiO_2$ is replaced by air. This change is particularly important for high frequency operation because power consumption increases proportional to frequency.

Additionally, the crosstalk increases more than 50% when scaling down from 0.50 μm to 0.25 μm, primarily due to the increase in line-to-line capacitance. The increase in crosstalk/$V_{cc}$ ratio degrades the noise margin and circuit performance. Replacing $SiO_2$ with air will significantly reduce crosstalk because of the small dielectric constant of air, which is generally less than 1.001.

Thus it has hereto been discovered that replacing silicon dioxide with air as a dielectric material results in reduced crosstalk and decreased power consumption. A method for producing a semiconductor device is disclosed here that utilizes sol-gel processing to form air gaps between metal leads to provide a low dielectric constant (e.g. of about 1.25 between leads) which substantially reduces the capacitive coupling between conductors in a circuit, and decreases power consumption.

The present invention includes a method for forming air gaps between metal leads of a semiconductor device. A metal layer is deposited on a substrate. The metal layer is etched to form metal leads, leaving portions of the substrate exposed. A disposable liquid is deposited on the metal leads and the exposed portions of substrate. A top portion of the disposable liquid is removed to expose the tops of the metal leads. A porous silica precursor film (e.g. 10–70% porosity) is deposited on the disposable liquid and the tops of the metal leads. The porous silica precursor film is gelled to form a low-porosity silica film. The disposable liquid is removed through the low-porosity silica film to form air gaps between the metal leads.

An advantage of the invention includes a novel method of forming air gaps between metal leads while providing a low-porosity silica film atop the air caps and metal leads. The air gaps have a low dielectric constant and result in reduced sidewall capacitance between the metal leads, and decreased power consumption of the circuit.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 10 | | Semiconductor wafer | |
| 12 | Silicon | Substrate | May contain other metal interconnect layers or semiconductor elements, (e.g. transistors, diodes); Compound semiconductors (e.g. GaAs, InP, Si/Ge, SiC). |
| 14 | $SiO_2$ | First oxide layer | TEOS (tetraethosiloxane), PETEOS (plasma-enhanced TEOS), BPSG (boron phosphate silicate glass), other dielectric materials. |
| 16 | Aluminum | Metal leads | Titanium with an Aluminum bilayer (TiN/Al/TiN or Ti/AlCu/TiN); Alloys of Al, Cu, Mo, W, Ti; Polysilicon, silicides, nitrides, carbides; AlCu alloy with Ti or TiN underlayers; Metal interconnect layer. |
| 18 | Decane | Disposable liquid | A second solvent with molecules small enough to fit through pores of porous silica precursor film 20, having a boiling point equal to or above that of the first solvent in the porous silica precursor film 20. |
| 20 | Silicon dioxide-based gel comprising a polar solvent | Porous silica precursor film (generally 10–70% porosity) | Other sol-gels (e.g. aluminum silica, aluminum nitride, etc...) comprising a first solvent; a sol-gel with pores large enough for molecules of disposable liquid 18 to move through it. |

TABLE 1-continued

| Drawing Element | Preferred or Specific Examples | Generic Term | Other Alternate Examples or Descriptions |
|---|---|---|---|
| 22 | | Air gaps | In general, the term "air" to include all types of voids, inert gases, or vacuum. |
| 24 | Silicon dioxide-based xerogel | Low-porosity silica film | Other sol-gels; 10–50% low-porosity silica film; dense silica film. |
| 26 | | Passivating layer | Oxide or nitride layer, (e.g. conformal); $SiO_2$ deposited by plasma at low temperature; SACVD oxide layer; plasma-enhanced nitride layer; LPCVD oxide. |
| 28 | TEOS | Structural dielectric layer | Other oxide, nitride, or both. |

Figure 1:
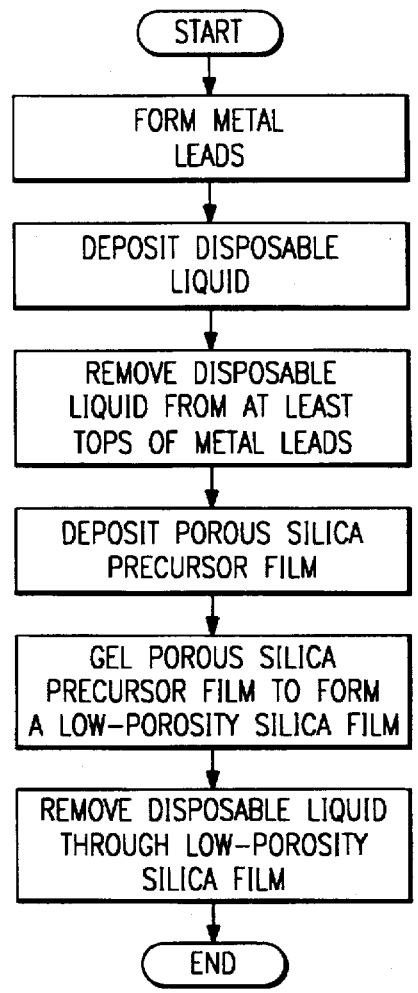
FIG. 1 is a flow chart showing possible steps of the invention.

Typical embodiments of the invention may be comprised of the steps shown in the flow chart of FIG. 1, although not all steps shown may be required in a given embodiment, and other steps may be added in other embodiments. This flow chart shows that metal leads are formed and a disposable liquid is deposited. The disposable liquid is removed from at least the tops of the metal leads. Then a porous silica precursor film is deposited and gelled to form a low-porosity silica film. The disposable liquid is removed through the low-porosity silica film.

A first embodiment of the invention is shown in FIG. 2. FIG. 2A shows a cross-sectional view of a semiconductor wafer 10 having a substrate 12 which may, for example, contain transistors, diodes, and other semiconductor elements (not shown) as are well known in the art. The substrate 12 may also contain metal interconnect layers. First oxide layer 14 has been deposited over the substrate 12 and comprises $SiO_2$. First oxide layer 14 could also comprise PETEOS (plasma-enhanced tetraethosiloxane), BPSG (boron phosphate silicate glass) or other dielectric materials. A metal interconnect layer has been deposited over oxide layer 14. The metal interconnect layer preferably comprises aluminum, but may, for example, comprise a titanium-tungsten/aluminum bilayer or other metal. The metal interconnect layer is etched in a predetermined pattern to form etch lines, or metal leads 16.

Figure 2A:
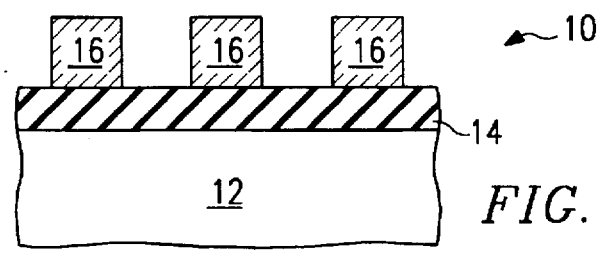
FIGS. 2a–2e show cross-sections of a portion of a semiconductor device, illustrating several steps in a first embodiment of the invention.
Figure 2B:
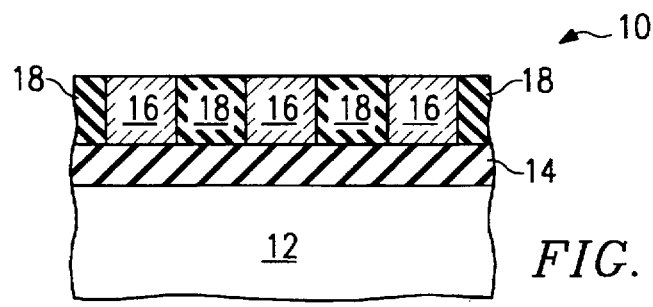
Figure 2C:
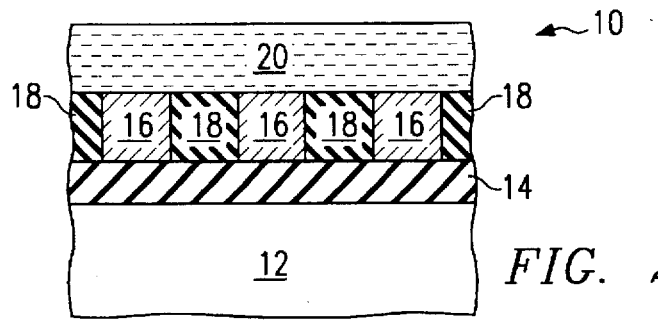

FIG. 2B shows the wafer 10 after a disposable liquid 18 has been deposited over metal leads 16 and oxide layer 14. The disposable liquid 18 may, for example, be spun onto the wafer 10 at a slow speed in an amount approximately two times the metal lead 16 height, in order to fill all spaces between leads with the disposable liquid 18. Then, the wafer 10 may be spun at a higher rate of speed to remove some of the disposable liquid 18 from the wafer 10 (by centrifugal force) and lower the disposable liquid 18 depth to 60–100% of the metal lead. 16 height (FIG. 2B). Preferably, the depth of the disposable liquid 18 is between 70–90% of the metal lead 16 height. Then porous silica precursor film 20 is deposited on disposable liquid 18 and at least the tops of metal leads 16, as shown in FIG. 2C.

Porous silica precursor film 20 is a sol coating preferably comprised of a silicon dioxide-based gel, although other sol-gels with pores large enough for the molecules of the disposable liquid 18 to move through may also be used. The porous silica precursor film 20 comprises a first solvent, which is preferably polar. Disposable liquid 18 is comprised of a second solvent, which is preferably decane, but could also be other non-polar solvents compatible for use with sol-gel processing. One of the first solvent and the second solvent is preferably polar and the other non-polar. The disposable liquid 18 comprises a second solvent that is partially miscible or entirely immiscible in the first solvent contained in the porous silicon film 20. The boiling point of the disposable liquid 18 should generally be equal to or above that of the first solvent contained in the porous silica precursor film 20. These properties are desirable so that the porous silica precursor film 20 can be dried to form a low-porosity silica film 24 before the disposable liquid 18 is removed. Preferrably, the porous silica precursor film 20 is gelled, aged, and dried to form the low-porosity silica film 24. The gellation of the porous silica precursor film 20 may result in a slight decrease in thickness, so that low-porosity silica film 24 is thinner than porous silica precursor film 20.

Figure 2D:
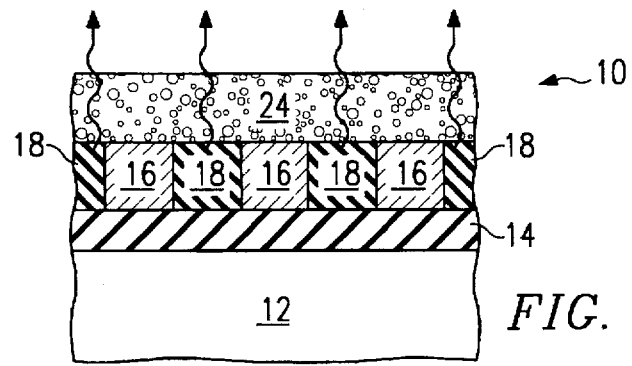
Figure 2E:
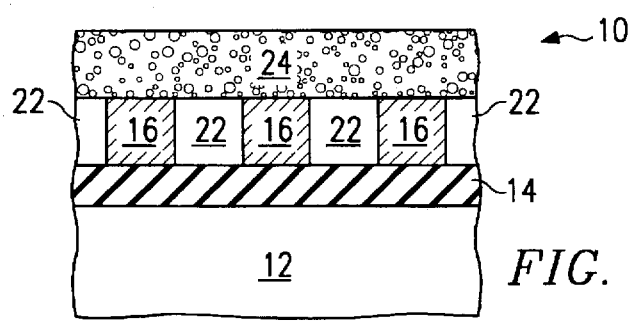

Then the disposable liquid 18 is removed by evaporation through the low-porosity silica film 24 (see the arrows in FIG. 2D). The removal of the disposable liquid 18 forms air gaps 22 between metal leads 16 as shown in FIG. 2D. The removal of the disposable liquid 18 is preferably accomplished by slowly drying the wafer 10 so that first the porous silica precursor film 20 undergoes gellation (possibly by a pH change) to form low-porosity silica film 24. Then, disposable liquid 18 is evaporated through the pores in low-porosity silica film 24, leaving the structure shown in FIG. 2E.

A second embodiment of the present invention is illustrated in FIG. 3. In FIG. 3A, the disposable liquid 18 has been deposited on the wafer 10 such that the disposable liquid 18 fills the spaces between the metal leads 16 and covers the tops of the metal leads 16. Then the wafer 10 may be spun to remove the disposable liquid 18 from at least the tops of the metal leads 16. FIG. 3B shows disposable liquid 18 having a height of approximately 80% of the metal lead 16 height. Other methods may be used to decrease the height of the disposable liquid 18. For example, it may be evaporated to reach the desired height.

Figure 3A:
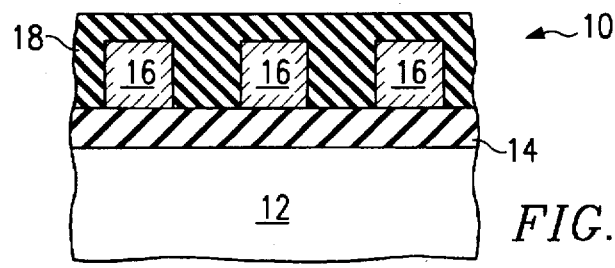
FIGS. 3a–3e show cross-sections of a portion of a semiconductor device, illustrating several steps in a second embodiment of the invention.
Figure 3B:
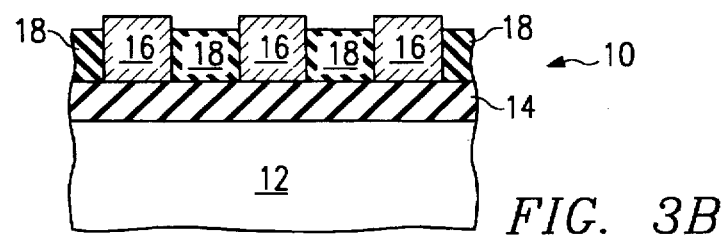
Figure 3C:
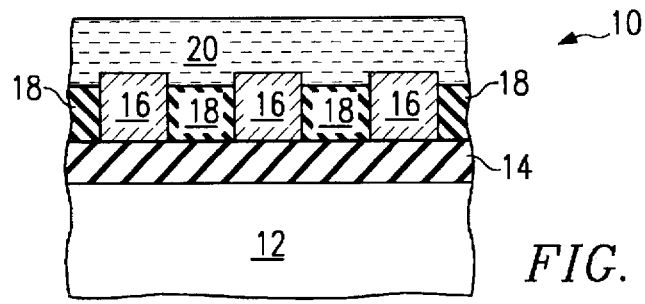
Figure 3D:
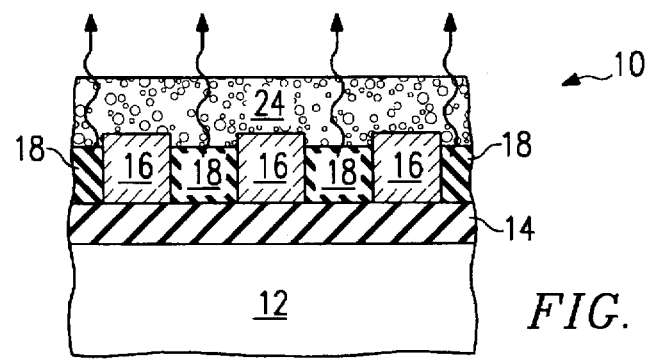
Figure 3E:
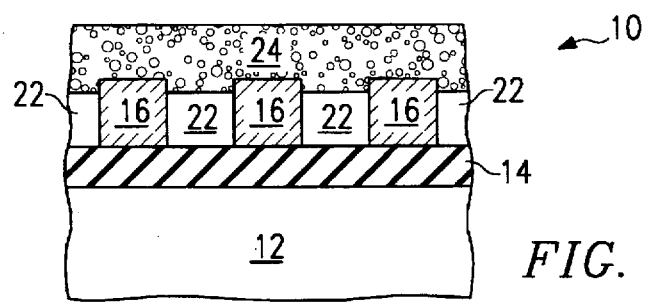

Next, porous silica precursor film 20, a sol-gel comprising a first solvent, is deposited on disposable liquid 18 and at least tops of metal leads 16, as shown in FIG. 3C. The porous silica precursor film 20 undergoes gellation to form low-porosity silica film 24, then the disposable liquid 18 is removed through the low-porosity silica film 24 as shown in FIG. 3D. The removal of the disposable liquid 18 forms air gaps 22 between metal leads 16 as shown in FIG. 3E.

Figure 4A:
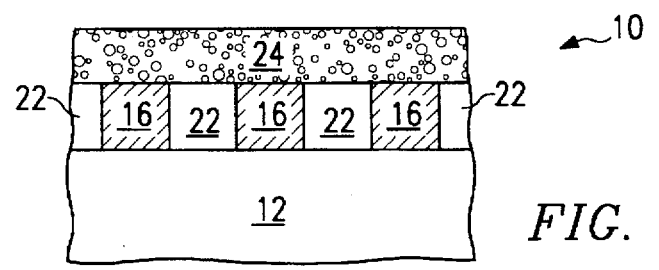
FIGS. 4a–4c show cross-sections of a portion of a semiconductor device, illustrating third, fourth and fifth embodiments of the invention.
Figure 4B:
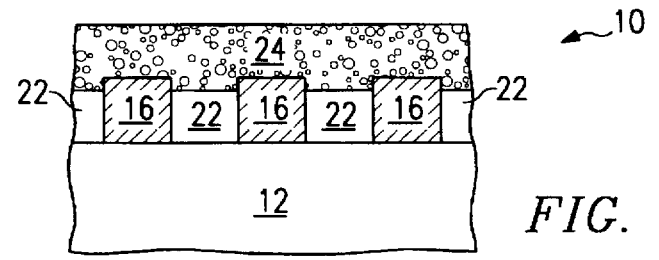
Figure 4C:
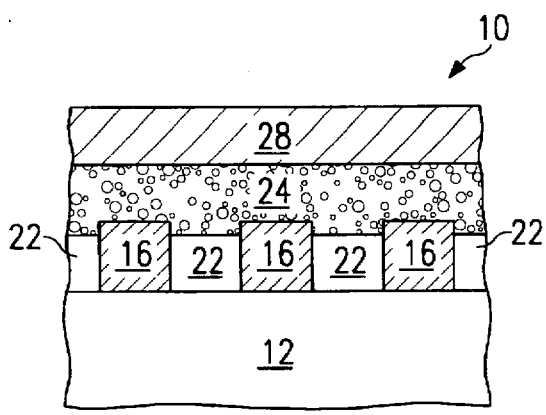

FIG. 4A shows a third embodiment of the invention, where the substrate 12 comprises a top oxide layer, upon which metal leads 16 have been formed, and upon which subsequent process steps described in the first embodiment of the invention have been performed. FIG. 4B depicts a fourth embodiment combining features of the second and third embodiments, where 70–90% of the metal lead 16 height has been covered with disposable liquid 18 and the metal leads 16 have been formed directly on the substrate 12 having a top oxide layer. FIG. 4C shows a fifth embodiment of the invention where a structural dielectric layer 28 comprising TEOS, for example, is deposited on low-porosity silica film 24 as a final step. This structural dielectric layer 28 can also be deposited on the structures shown in FIGS. 2E and 3E to provide added structural support for the wafer 10.

Figure 5A:
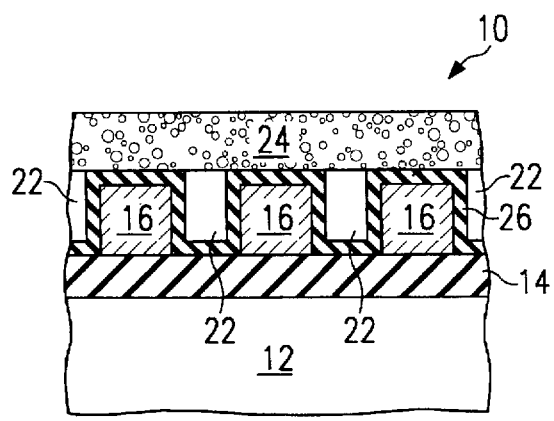
FIGS. 5a and 5b show cross-sections of two alternate embodiments, with the added feature of a passivating layer deposited over metal leads.
Figure 5B:
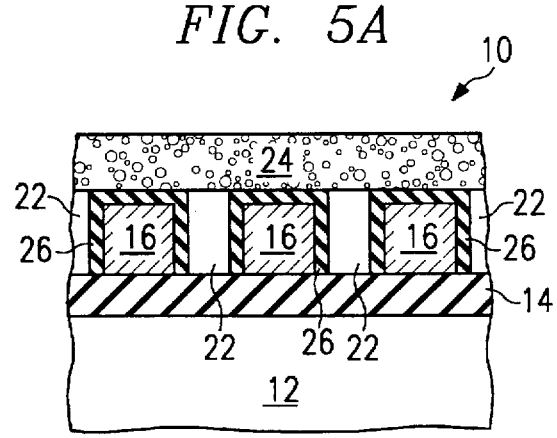

Oxide layer 14 and metal leads 16 may have active surfaces which can act as paths for leakage current if left unpassivated. FIG. 5A shows an alternate embodiment in which a (for example, conformal) passivating layer 26 passivates both exposed surfaces of oxide layer 14 and metal leads 16 to prevent interlead leakage. Another alternate embodiment (FIG. 5B) involves exposing the metal leads to a gas to react and form a passivating layer 26 only around metal leads 16.

Figure 6:
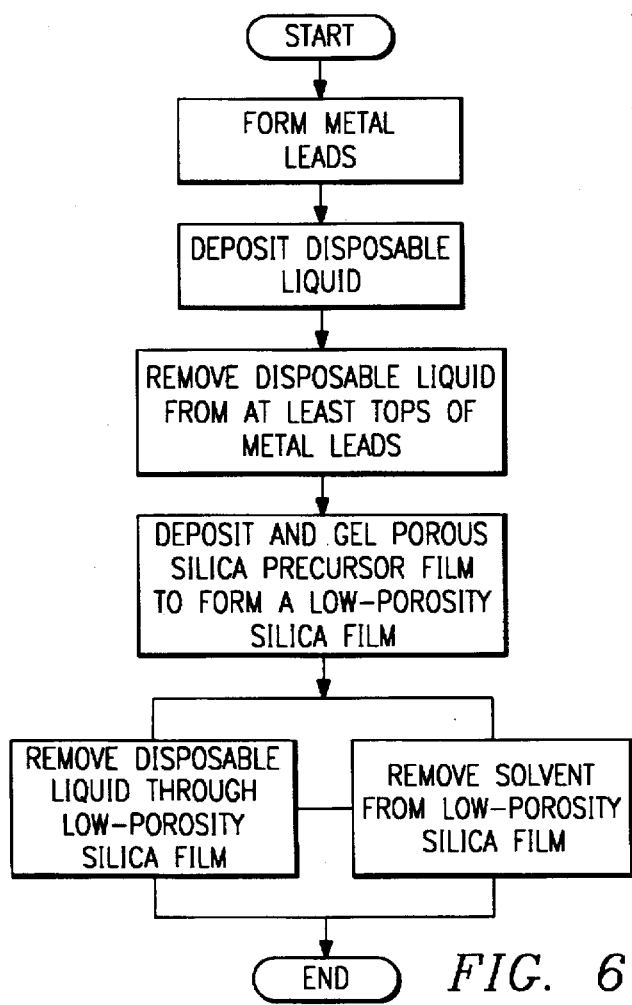
FIG. 6 is a flow chart for a possible embodiment of the invention.

The flow chart of FIG. 6 shows that the removal of the disposable liquid 18 and the removal of the first solvent from gelled low-porosity silica film 24 may occur simultaneously. This may be accomplished by a single slow drying step. The same solvent or miscible solvents may be used in this approach, with the porous silica precursor film 20 being applied (e.g. as a viscous layer) and quickly gelled to minimize mixing. The porous silica precursor film 20 can be a gel at this time prior to drying.

The present invention offers a novel method of forming air gaps between metal leads using sol-gel processing. The air gaps have a low dielectric constant and result in reduced sidewall capacitance of the metal leads and decreased power consumption of the circuit.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming air gaps between metal leads of a semiconductor device, comprising the steps of:
   depositing a metal layer on a substrate;
   etching said metal layer in a pattern to form metal leads, said metal leads having tops, wherein portions of said substrate remain exposed;
   depositing a disposable liquid on said metal leads and said exposed portions of substrate;
   removing a top portion of said disposable liquid to lower said disposable liquid to a level at least as low as said tops of said metal leads;
   depositing a porous silica precursor film on said disposable liquid and at least said tops of said leads, said porous silica precursor film comprising a first solvent;
   gelling said porous silica precursor film to form a low-porosity silica film;
   removing said disposable liquid through said low-porosity silica film to form air gaps between said metal leads beneath said low-porosity silica film.

2. The method of claim 1 wherein said disposable liquid reaches said tops of said leads, after said depositing a disposable liquid step.

3. The method of claim 1 further comprising the step of forming a passivating layer on at least said metal leads, after said step of etching said metal layer in a pattern to form metal leads.

4. The method of claim 3 wherein said passivating layer comprises a nitride.

5. The method of claim 1 wherein said removing said disposable liquid through said low-porosity silica film step comprises heating said wafer to vaporize said disposable liquid.

6. The method of claim 1 wherein said removing said disposable liquid through said low-porosity silica film step comprises applying a vacuum to said wafer to remove said disposable liquid.

7. The method of claim 1 wherein said porous silica precursor film further comprises a sol-gel.

8. The method of claim 1 wherein said disposable liquid comprises said first solvent.

9. The method of claim 1 wherein said disposable liquid comprises a second solvent.

10. The method of claim 1 or claim 8 wherein said first solvent comprises decane.

11. The method of claim 1 further comprising the step of depositing a structural dielectric layer, after said removing said disposable liquid step.

12. A method for forming air gaps between metal leads of a semiconductor device, comprising the steps of:
    depositing a metal layer on a substrate;
    etching said metal layer in a pattern to form metal leads, said metal leads having tops, wherein portions of said substrate are exposed;
    depositing a disposable liquid on said substrate layer and said metal leads;
    removing a top portion of said disposable liquid to lower said disposable liquid to a level at least as low as the tops of said metal leads;
    depositing a sol-gel on said disposable liquid and at least said tops of said metal leads, said sol-gel comprising a first solvent;
    gelling said sol-gel to form a low-porosity silica film;
    removing said disposable liquid through said low-porosity silica film to form air gaps between said metal leads beneath said low-porosity silica film.

13. The method of claim 12 further comprising the step of forming a passivating layer on at least said metal leads, after said step of etching said metal layer in a pattern to form metal leads.

14. The method of claim 13 wherein said passivating layer comprises a nitride.

15. The method of claim 12 further comprising the step of depositing a structural dielectric layer, after said removing said disposable liquid step.

* * * * *